United States Patent
Park et al.

(10) Patent No.: US 11,296,276 B2
(45) Date of Patent: Apr. 5, 2022

(54) MEMORY DEVICE BASED ON MULTI-BIT PERPENDICULAR MAGNETIC TUNNEL JUNCTION

(71) Applicant: Industry-University Cooperation Foundation Hanyang University, Seoul (KR)

(72) Inventors: Jea Gun Park, Seongnam-si (KR); Jong Ung Baek, Seongnam-si (KR); Kei Ashiba, Seoul (KR); Jin Young Choi, Seoul (KR); Mi Ri Park, Incheon (KR); Hyun Gyu Lee, Seoul (KR); Han Sol Jun, Seoul (KR); Sun Hwa Jung, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 49 days.

(21) Appl. No.: 16/688,510

(22) Filed: Nov. 19, 2019

(65) Prior Publication Data

US 2021/0135091 A1    May 6, 2021

(30) Foreign Application Priority Data

Nov. 5, 2019 (KR) .................. 10-2019-0140529

(51) Int. Cl.
| | |
|---|---|
| *H01L 43/02* | (2006.01) |
| *G11C 11/15* | (2006.01) |
| *H01L 27/22* | (2006.01) |
| *H01L 43/10* | (2006.01) |

(52) U.S. Cl.
CPC .............. *H01L 43/02* (2013.01); *G11C 11/15* (2013.01); *H01L 27/222* (2013.01); *H01L 43/10* (2013.01)

(58) Field of Classification Search
CPC ........ H01L 43/02; H01L 43/10; H01L 27/222
See application file for complete search history.

(56) References Cited

U.S. PATENT DOCUMENTS

| | | | | |
|---|---|---|---|---|
| 2002/0167033 | A1* | 11/2002 | Okazawa | ................ G11C 11/15 257/295 |
| 2016/0055893 | A1 | 2/2016 | Zhang et al. | |
| 2018/0006213 | A1* | 1/2018 | Park | ....................... G11C 11/15 |
| 2019/0027201 | A1* | 1/2019 | Petti | ..................... G11C 11/1675 |

(Continued)

FOREIGN PATENT DOCUMENTS

| | | |
|---|---|---|
| CN | 102938257 A | 2/2013 |
| CN | 106803532 A | 6/2017 |
| JP | 2008-252036 A | 10/2008 |

(Continued)

OTHER PUBLICATIONS

Communication dated Nov. 19, 2020, issued by the Taiwanese Patent Office in application No. 109104286.

(Continued)

*Primary Examiner* — Jerome Leboeuf
(74) *Attorney, Agent, or Firm* — Sughrue Mion, PLLC (57) ABSTRACT

Disclosed is a memory device including a multi-bit perpendicular magnetic tunnel junction, wherein the multi-bit perpendicular magnetic tunnel junction includes an upper synthetic antiferromagnetic layer, pinned layer, lower dual free layer, and upper free layer formed in a laminated manner between a top electrode and a bottom electrode.

13 Claims, 8 Drawing Sheets

(56) References Cited

U.S. PATENT DOCUMENTS

2020/0185016 A1\* 6/2020 Sakhare ............... G11C 11/161

FOREIGN PATENT DOCUMENTS

| KR | 10-2016-0113048 A | 9/2016 |
|----|-------------------|--------|
| KR | 10-2019-0087943 A | 7/2019 |
| TW | I565109 B | 1/2017 |

OTHER PUBLICATIONS

Communication dated Dec. 17, 2019, issued by the Korean Intellectual Property Office in Korean Application No. 10-2019-0140529.

\* cited by examiner

MEMORY DEVICE BASED ON MULTI-BIT PERPENDICULAR MAGNETIC TUNNEL JUNCTION

CROSS-REFERENCE TO RELATED APPLICATION

This application claims priority to Korean Patent Application No. 10-2019-0140529, filed on Nov. 5, 2019 in the Korean Intellectual Property Office, the disclosure of which is incorporated herein by reference

BACKGROUND OF THE DISCLOSURE

Field of the Disclosure

The present disclosure relates to a magnetic tunnel junction of a memory device, and more particularly, to a technical idea of implementing multi-bit operation in a perpendicular magnetic tunnel junction provided in a magnetic nonvolatile memory capable of performing high-speed rewriting.

Description of the Related Art

A storage-class-memory (SCM) based on a 3D crosspoint array has been proposed to replace a conventional DRAM and NAND flash memory.

In particular, a perpendicular-spin-transfer-torque (p-STT) MRAM, a next-generation memory, is a low-power and high-speed device, and is commercialized in the form of an embedded memory.

An SCM, which consists of a p-STT MRAM, can implement read/write speeds similar to those of a DRAM and twice the latency of a DRAM, and thus, has been in the spotlight as a next-generation memory to replace DRAMs.

However, it is difficult to replace a NAND flash memory that performs a triple level cell (TLC) operation with only a p-STT MRAM that operates in a single bit.

Accordingly, to replace a NAND flash memory with a p-STT MRAM, a perpendicular-magnetic tunnel junction (p-MTJ) capable of performing multi-bit operation should be provided.

Specifically, a conventional full p-MTJ spin valve (SV) structure may be realized with a structure composed of a bottom electrode, a seed layer, synthetic anti-ferromagnetic (SyAF) multi-layers, a bridge layer, a pinned layer, a tunnel barrier layer, a free layer (information storage layer), a capping layer, and a top electrode.

That is, a conventional full p-MTJ spin valve supports a single-bit operation wherein, when the magnetization direction of a pinned layer and the magnetization direction of a free layer are parallel, the state of the full p-MTJ spin valve transitions to a parallel state, and when the directions are anti-parallel, the state of full p-MTJ spin valve transitions to an anti-parallel state. However, there is a problem that a conventional full p-MTJ spin valve does not support multi-bit operation.

In addition, in the case of a conventional full p-MTJ spin valve, since a synthetic antiferromagnetic layer for fixing the perpendicular magnetism of a CoFeB pinned layer in a spin valve, which is an upper pinned layer, is formed of a rare-earth element, the degree of diffusion is severe. In addition, due to increase in the number of layers, process cost and process time may be increased.

RELATED ART DOCUMENTS

Patent Documents

Korean Patent Application Publication No. 10-2016-0113048, "PERPENDICULAR-SPIN-TRANSFER-TORQUE (STT) MEMORY CELL HAVING DUAL MGO INTERFACE AND COFEB LAYER FOR ENHANCING PERPENDICULAR MAGNETIC ANISOTROPY"

SUMMARY OF THE DISCLOSURE

Therefore, the present disclosure has been made in view of the above problems, and it is an object of the present disclosure to provide a multi-bit perpendicular magnetic tunnel junction capable of performing multi-bit operation by achieving four types of resistance states depending on the magnetization direction of a lower dual free layer and the magnetization direction of an upper free layer.

It is another object of the present disclosure to provide a multi-bit perpendicular magnetic tunnel junction that may implement multi-bit operation through a simple structure using a lower dual free layer and an upper free layer and that allows high integration.

In accordance with one aspect of the present disclosure, provided is a multi-bit perpendicular magnetic tunnel junction including an upper synthetic antiferromagnetic layer, pinned layer, lower dual free layer, and upper free layer formed in a laminated manner between a top electrode and a bottom electrode.

The multi-bit perpendicular magnetic tunnel junction according to an embodiment may exhibit any one resistance state of first to fourth resistance states depending on magnetization directions of the lower dual free layer and the upper free layer.

The first resistance state may be a resistance state that appears when magnetization directions of the upper synthetic antiferromagnetic layer and the pinned layer and a magnetization direction of the lower dual free layer are parallel and magnetization directions of the lower dual free layer and the upper free layer are parallel.

The second resistance state may be a resistance state that appears when magnetization directions of the upper synthetic antiferromagnetic layer and the pinned layer and a magnetization of the lower dual free layer are anti-parallel and magnetization directions of the lower dual free layer and the upper free layer are parallel.

The third resistance state may be a resistance state that appears when magnetization directions of the upper synthetic antiferromagnetic layer and the pinned layer and a magnetization direction of the lower dual free layer are parallel and magnetization directions of the lower dual free layer and the upper free layer are anti-parallel.

The fourth resistance state may be a resistance state that appears when magnetization directions of the upper synthetic antiferromagnetic layer and the pinned layer and a magnetization direction of the lower dual free layer are anti-parallel and magnetization directions of the lower dual free layer and the upper free layer are anti-parallel.

When a magnitude of a magnetic field applied from outside is swept in a range of a predetermined first threshold value to a predetermined second threshold value, the any one resistance state may be sequentially switched in an order of the second resistance state, the fourth resistance state, the first resistance state, and the third resistance state.

The multi-bit perpendicular magnetic tunnel junction according to an embodiment may further include a lower tunnel barrier layer formed between the pinned layer and the lower dual free layer and an upper tunnel barrier layer formed between the lower dual free layer and the upper free layer.

The lower dual free layer may include a first lower free layer, upper spacing layer, and second lower free layer formed in a laminated manner.

The multi-bit perpendicular magnetic tunnel junction according to an embodiment may further include a lower synthetic antiferromagnetic layer formed under the upper synthetic antiferromagnetic layer.

The multi-bit perpendicular magnetic tunnel junction according to an embodiment may further include a lower spacing layer formed between the lower and upper synthetic antiferromagnetic layers and a bridge layer disposed between the upper synthetic antiferromagnetic layer and the pinned layer.

In accordance with another aspect of the present disclosure, provided is a multi-bit perpendicular magnetic tunnel junction including an upper synthetic antiferromagnetic layer, pinned layer, lower dual free layer, and upper multiple free layer formed in a laminated manner between a top electrode and a bottom electrode.

The multi-bit perpendicular magnetic tunnel junction according to another embodiment may exhibit any one resistance state of first to fourth resistance states depending on magnetization directions of the lower dual free layer and the upper multiple free layer.

The first resistance state may be a resistance state that appears when magnetization directions of the upper synthetic antiferromagnetic layer and the pinned layer and a magnetization direction of the lower dual free layer are parallel and magnetization directions of the lower dual free layer and the upper multiple free layer are parallel.

The second resistance state may be a resistance state that appears when magnetization directions of the upper synthetic antiferromagnetic layer and the pinned layer and a magnetization direction of the lower dual free layer are parallel and magnetization directions of the lower dual free layer and the upper multiple free layer are anti-parallel.

The third resistance state may be a resistance state that appears when magnetization directions of the upper synthetic antiferromagnetic layer and the pinned layer and a magnetization direction of the lower dual free layer are anti-parallel and magnetization directions of the lower dual free layer and the upper multiple free layer are parallel.

The fourth resistance state may be a resistance state that appears when magnetization directions of the upper synthetic antiferromagnetic layer and the pinned layer and a magnetization direction of the lower dual free layer are anti-parallel and magnetization directions of the lower dual free layer and the upper multiple free layer are anti-parallel.

When a magnitude of a magnetic field applied from outside is swept in a range of a predetermined first threshold value to a predetermined second threshold value, the any one resistance state may be sequentially switched in an order of the third resistance state, the second resistance state, the first resistance state, and the fourth resistance state.

The multi-bit perpendicular magnetic tunnel junction according to another embodiment may further include a lower tunnel barrier layer formed between the pinned layer and the lower dual free layer and an upper tunnel barrier layer formed between the lower dual free layer and the upper multiple free layer.

The upper multiple free layer may include a first upper free layer, bridge layer, and second upper free layer formed in a laminated manner, and the second upper free layer may be formed in a multilayer structure based on $[Co/Pt]_b$ (b being a positive integer).

The multi-bit perpendicular magnetic tunnel junction according to another embodiment may further include a lower synthetic antiferromagnetic layer formed under the upper synthetic antiferromagnetic layer.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

The embodiments will be described in detail herein with reference to the drawings.

However, it should be understood that the present disclosure is not limited to the embodiments according to the concept of the present disclosure, but includes changes, equivalents, or alternatives falling within the spirit and scope of the present disclosure.

In the following description of the present disclosure, a detailed description of known functions and configurations incorporated herein will be omitted when it may make the subject matter of the present disclosure unclear.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, the expression "processor configured to perform A, B, and C" may mean that a general-purpose processor (e.g., CPU or application processor) performs the corresponding operations by executing a dedicated processor (e.g., an embedded processor) or one or more software programs stored in the memory device.

In addition, the expression "or" means "inclusive or" rather than "exclusive or".

That is, unless otherwise mentioned or clearly inferred from context, the expression "x uses a or b" means any one of natural inclusive permutations.

In the above-described specific embodiments, elements included in the invention are expressed singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

Figure 1:
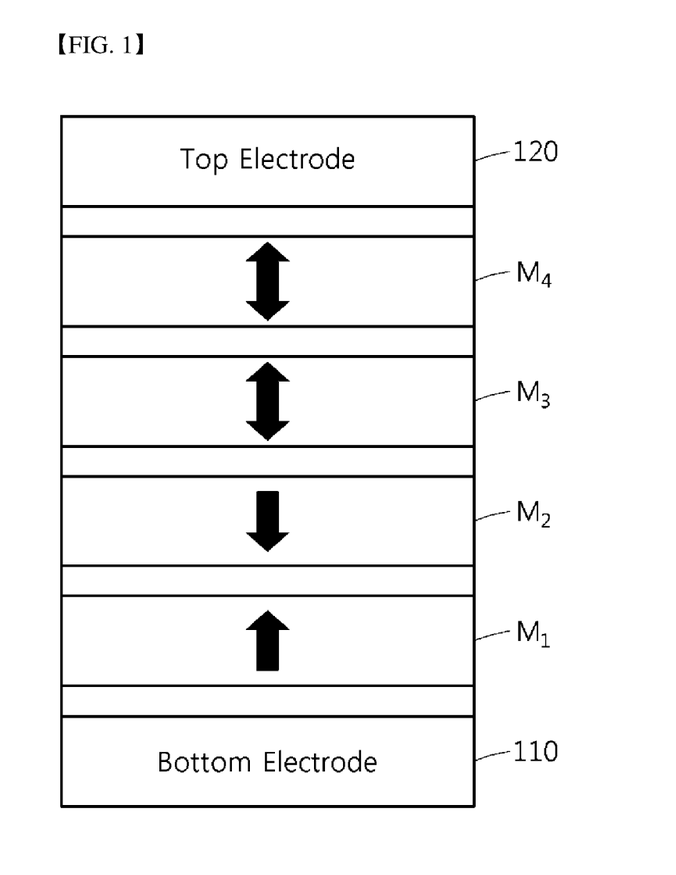
FIG. 1 is a schematic diagram showing a multi-bit perpendicular magnetic tunnel junction according to an embodiment of the present disclosure.

FIG. 1 is a schematic diagram showing a multi-bit perpendicular magnetic tunnel junction according to an embodiment of the present disclosure.

Referring to FIG. 1, the multi-bit perpendicular magnetic tunnel junction according to an embodiment of the present disclosure may implement multi-bit operation by achieving four types of resistance states depending on the magnetization direction of a lower dual free layer and the magnetization direction of an upper free layer.

In addition, the multi-bit perpendicular magnetic tunnel junction may implement multi-bit operation and high integration in a device through a simple structure based on a lower dual free layer and an upper free layer.

Specifically, the multi-bit perpendicular magnetic tunnel junction may include a first magnetic layer $M_1$, second magnetic layer $M_2$, third magnetic layer $M_3$, and fourth magnetic layer $M_4$ formed in a laminated manner between a top electrode 120 and a bottom electrode 110.

According to one aspect of the present disclosure, the first magnetic layer $M_1$ may include a lower synthetic antiferromagnetic (SyAF) layer, the second magnetic layer $M_2$ may include an upper synthetic antiferromagnetic (SyAF) layer, a bridge layer, and a pinned layer, the third magnetic layer $M_3$ may include a lower dual free layer, and the fourth magnetic layer $M_4$ may include an upper free layer.

According to one aspect of the present disclosure, the upper free layer may be formed in a single-layer structure or a multilayer structure.

For example, the upper free layer may include a CoFeB material and may be formed in a single layer having a thickness of 0.8 nm to 1.5 nm. In addition, the upper free layer may include a first upper free layer, a bridge layer, and a second upper free layer, and the second upper free layer may be formed in a multilayer structure based on $[Co/Pt]_b$ (b being a positive integer).

That is, the multi-bit perpendicular magnetic tunnel junction according to an embodiment of the present disclosure may implement multi-bit operation by forming in a structure, in which the lower synthetic antiferromagnetic layer, the upper synthetic antiferromagnetic layer, the lower dual free layer, and the upper free layer are laminated, and achieving four types of resistance states depending on the magnetization directions of the lower dual free layer and the upper free layer.

The multi-bit perpendicular magnetic tunnel junction according to an embodiment of the present disclosure will be described in more detail with reference to FIGS. 2 to 8.

Figure 2:
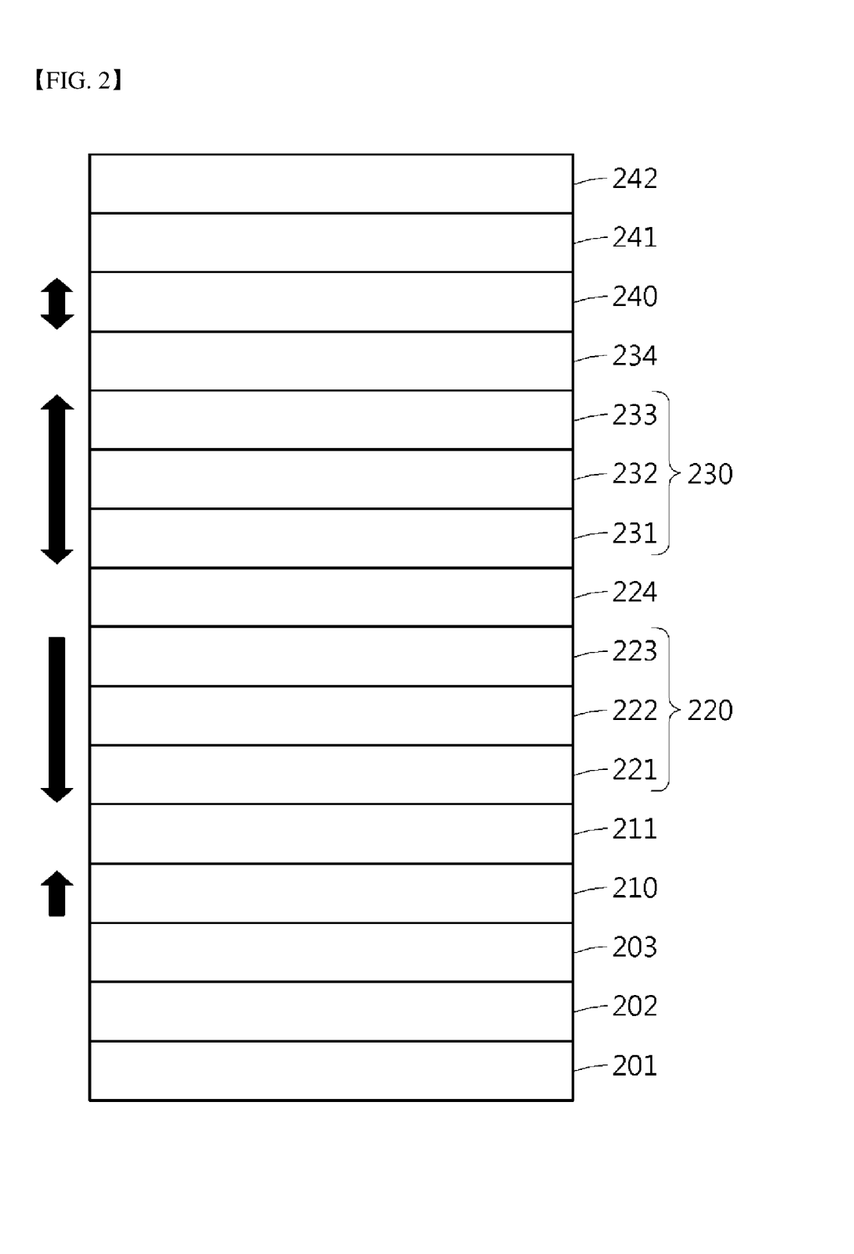
FIG. 2 is a cross-sectional view of a multi-bit perpendicular magnetic tunnel junction according to a first embodiment of the present disclosure.

FIG. 2 is a cross-sectional view of a multi-bit perpendicular magnetic tunnel junction according to a first embodiment of the present disclosure.

Referring to FIG. 2, the multi-bit perpendicular magnetic tunnel junction according to the first embodiment may include an upper synthetic antiferromagnetic layer 221, pinned layer 223, lower dual free layer 230, and upper free layer 240 formed in a laminated manner between a top electrode 242 and a bottom electrode 202.

According to an embodiment of the present disclosure, the multi-bit perpendicular magnetic tunnel junction according to the first embodiment may further include a lower synthetic antiferromagnetic layer 210 formed under the upper synthetic antiferromagnetic layer 221.

In addition, the multi-bit perpendicular magnetic tunnel junction according to the first embodiment may further include a lower spacing layer 211 formed between the lower and upper synthetic antiferromagnetic layers 210 and 221 and a bridge layer 222 formed between the upper synthetic antiferromagnetic layer 221 and the pinned layer 223.

In addition, the multi-bit perpendicular magnetic tunnel junction according to the first embodiment may further include a lower tunnel barrier layer 224 formed between the pinned layer 223 and the lower dual free layer 230 and an upper tunnel barrier layer 234 formed between the lower dual free layer 230 and the upper free layer 240.

In addition, the multi-bit perpendicular magnetic tunnel junction according to the first embodiment may further include a capping layer 241 formed between the top electrode 242 and the upper free layer 240, a seed layer 203 formed on an upper portion of the bottom electrode 202, and a substrate 201 formed on a lower portion of the bottom electrode 202.

Specifically, a semiconductor substrate may be used as the substrate 201. For example, the substrate 201 may include silicon substrates, gallium arsenide substrates, silicon germanium substrates, silicon oxide substrates, and the like. According to an embodiment of the present disclosure, in the multi-bit perpendicular magnetic tunnel junction, a silicon substrate may be used. In addition, a selection element including a transistor may be formed on the substrate 201.

According to an embodiment of the present disclosure, an insulating layer may be formed on the substrate 201. The insulating layer may be formed to cover a predetermined structure such as the selection element, and a contact hole may be formed in the insulating layer to expose at least a portion of the selection element. The insulating layer may be formed using a silicon dioxide ($SiO_2$) film having an amorphous structure.

The bottom electrode 202 may be formed on the upper portion of the insulating layer. The bottom electrode 202 may be formed using a conductive material such as a metal or a metal nitride.

In addition, the multi-bit perpendicular magnetic tunnel junction according to the first embodiment may be formed in a dual structure of first and second bottom electrodes. The first bottom electrode may be formed on the insulating layer, and the second bottom electrode may be formed on the first bottom electrode. In addition, the first bottom electrode may be formed inside the insulating layer, and thus may be connected to the selection element formed on the substrate 201.

The first and second bottom electrodes may be formed of a polycrystalline material. Accordingly, the first and second bottom electrodes may be formed of a conductive material having a bcc structure. For example, the first bottom electrode may be formed of a metal such as tungsten (W), and the second bottom electrode may be formed of a metal nitride such as a titanium nitride (TiN) film.

Preferably, the bottom electrode 202 has a structure in which a first bottom electrode including tungsten (W) and a second bottom electrode including TiN are laminated.

The first and second bottom electrodes may be formed of a polycrystalline material to improve the crystallinity of a magnetic tunnel junction to be formed later. That is, when the first and second bottom electrodes are formed, an amorphous magnetic tunnel junction formed thereon is grown in the crystal direction of the first bottom electrode, and when heat treatment is performed for perpendicular anisotropy, the crystallinity of the magnetic tunnel junction may be improved compared to a conventional magnetic tunnel junction.

Therefore, conventionally, since an amorphous seed layer and an amorphous magnetic tunnel junction are formed on an amorphous insulating layer, crystallinity is not improved compared to the present disclosure even after heat treatment. When the crystallinity of a magnetic tunnel junction is improved, the degree of magnetization generated when a magnetic field is applied may be increased, and current flowing through the magnetic tunnel junction may be increased in a parallel state. Accordingly, when such a magnetic tunnel junction is applied to a memory device, the operation speed and reliability of the device may be improved.

The seed layer 203 may be formed on an upper portion of the bottom electrode 202, and may be formed of a material that allows at least one crystal of the lower synthetic antiferromagnetic layer 210 and the upper synthetic antiferromagnetic layers 221 to grow.

The seed layer 203 may include metals selected the group consisting of tantalum (Ta), ruthenium (Ru), titanium (Ti), palladium (Pd), platinum (Pt), magnesium (Mg), cobalt (Co), aluminum (Al), and tungsten (W) or alloys thereof. Preferably, the seed layer 203 may be formed of platinum (Pt), and may be formed to have a thickness of 1 nm to 3 nm.

The lower synthetic antiferromagnetic layer 210, the lower spacing layer 211, and the upper synthetic antiferromagnetic layer 221 may be formed on an upper portion of the seed layer 203, and may serve to fix the magnetization of the pinned layer 223. The lower and upper synthetic antiferromagnetic layers 210 and 221 may be antiferromagnetically connected to each other through the lower spacing layer 211.

For example, the lower and upper synthetic antiferromagnetic layers 210 and 221 may each be formed in a structure in which a ferromagnetic metal and a nonmagnetic metal are alternately laminated. As the ferromagnetic metal, a single metal selected from the group consisting of iron (Fe), cobalt (Co), and nickel (Ni) or an alloy thereof may be used. As the nonmagnetic metal, a single metal selected from the group consisting of chromium (Cr), platinum (Pt), palladium (Pd), iridium (Ir), rhodium (Rh), ruthenium (Ru), osmium (Os), rhenium (Re), gold (Au), and copper (Cu) or an alloy thereof may be used.

In addition, the lower and upper synthetic antiferromagnetic layers 210 and 221 may each be formed of $[Co/Pd]_X$, $[Co/Pt]_X$, or $[CoFe/Pt]_X$ (X being an integer of 1 or more).

Preferably, the lower synthetic antiferromagnetic layer 210 is formed of $[Co/Pt]_X$ (X being an integer of 1 or more), and the upper synthetic antiferromagnetic layer 221 is formed in [Co/Pt/Co].

As a more specific example, the lower synthetic antiferromagnetic layer 210 may be formed of $[Co/Pt]_6$, in which Co and Pt are repeatedly laminated six times. In this case, Co may be formed to have a thickness of, e.g., 0.3 nm to 0.5 nm, and Pt may be formed to have a thickness thinner than or equal to Co, e.g., a thickness of 0.2 nm to 0.4 nm.

The lower spacing layer 211 may be formed between the lower and upper synthetic antiferromagnetic layers 210 and 221, and may be formed of a non-magnetic material so that the lower and upper synthetic antiferromagnetic layers 210 and 221 are diamagnetic ally connected to each other. For example, the lower spacing layer 211 may be formed of a single metal selected from the group consisting of ruthenium (Ru), rhodium (Rh), osmium (Os), rhenium (Re), and chromium (Cr) or an alloy thereof. Preferably, the lower spacing layer 211 is formed of ruthenium (Ru).

The bridge layer 222 may be formed on an upper portion of the upper synthetic antiferromagnetic layer 221, and may be formed of a polycrystalline material, e.g., a conductive material having a bcc structure. Preferably, the bridge layer 222 is formed of tungsten (W). In addition, the bridge layer 222 may be formed to have a thickness of, e.g., 0.3 nm to 0.5 nm.

The pinned layer 223 may be formed on an upper portion of the bridge layer 222, and the magnetization direction of the pinned layer 223 may be fixed. Preferably, the magnetization direction of the pinned layer 223 is fixed in the direction from top to bottom.

For example, the pinned layer 223 may be formed using a Full-Heusler semimetal alloy, which is a ferromagnetic substance, an amorphous rare-earth element alloy, a multilayer thin film in which a ferromagnetic metal and a nonmagnetic metal are alternately laminated, an alloy having an L10-type crystal structure, or a ferromagnetic material such as a cobalt-based alloy.

Examples of the Full-Heusler semimetal alloy may include CoFeAl, CoFeAlSi, and the like. Examples of the amorphous rare-earth element alloy may include alloys such as TbFe, TbCo, TbFeCo, DyTbFeCo, and GdTbCo. In addition, examples of the multilayer thin film, in which a nonmagnetic metal and a ferromagnetic metal are alternately laminated, may include [Co/Pt], Co/Pd, CoCr/Pt, Co/Ru, Co/Os, Co/Au, Ni/Cu, CoFeAl/Pd, CoFeAl/Pt, CoFeB/Pd, CoFeB/Pt, and the like. Examples of the alloy having an L10-type crystal structure may include $Fe_{50}Pt_{50}$, $Fe_{50}Pd_{50}$, $Co_{50}Pt_{50}$, $Fe_{30}Ni_{20}Pt_{50}$, $Co_{30}Ni_{20}Pt_{50}$, and the like. In addition, examples of the cobalt-based alloy may include CoCr, CoPt, CoCrPt, CoCrTa, CoCrPtTa, CoCrNb, CoFeB, and the like. Among these materials, a CoFeB single layer may be formed thicker than a multilayer structure of CoFeB and [Co/Pt] or Co/Pd, and thus the CoFeB single layer may increase a magnetoresistance ratio.

In addition, since CoFeB may be easily etched compared to other metals such as Pt and Pd, a CoFeB single layer may be easily prepared compared to a multilayer structure containing Pt or Pd. In addition to a perpendicular magnetization, CoFeB may have a horizontal magnetization through thickness adjustment. Preferably, the pinned layer 223 may be formed using a CoFeB single layer.

The lower tunnel barrier layer 224 may be formed on an upper portion of the pinned layer 223 to separate the pinned layer 223 and the lower dual free layer 230 and allow quantum mechanical tunneling between the pinned layer 223 and the lower dual free layer 230.

In addition, the upper tunnel barrier layer 234 may be formed on an upper portion of the lower dual free layer 230 to separate the lower dual free layer 230 and the upper free layer 240 and allow quantum mechanical tunneling between the lower dual free layer 230 and the upper free layer 240.

For example, the lower and upper tunnel barrier layers 224 and 234 may each be formed of magnesium oxide (MgO), aluminum oxide ($Al_2O_3$), silicon oxide ($SiO_2$), tantalum oxide ($Ta_2O_5$), a silicon nitride (SiNx), or an aluminum nitride (AlNx).

Preferably, the lower and upper tunnel barrier layers 224 and 234 are each formed using polycrystalline magnesium oxide. Subsequent heat treatment may result in magnesium oxide being textured in BCC (100).

The lower dual free layer 230 may be formed on an upper portion of the lower tunnel barrier layer 224, and the upper free layer 240 may be formed on an upper portion of the upper tunnel barrier layer 234.

According to an embodiment of the present disclosure, the lower dual free layer 230 may include a first lower free layer 231, upper spacing layer 232, and second lower free layer 233 formed in a laminated manner.

More specifically, in the lower dual free layer 230 and the upper free layer 240, magnetization is not fixed in one direction, and the direction of magnetization may be changed from one direction to the opposite direction. That is, the magnetization directions of the lower dual free layer 230 and the upper free layer 240 may be the same (i.e., parallel) as that of the pinned layer 223 or may be opposite (i.e., anti-parallel) to that of the pinned layer 223.

In addition, the first and second lower free layers 231 and 233 of the lower dual free layer 230 may be magnetized in the same direction or in different directions. For example, both the first and second lower free layers 231 and 233 may be magnetized in a vertical direction, or the first lower free layer 231 may be magnetized in the vertical direction and the second lower free layer 233 may be magnetized in the horizontal direction.

Accordingly, since the multi-bit perpendicular magnetic tunnel junction according to an embodiment of the present disclosure includes the lower dual free layer 230, thermal stability may be improved compared to a single storage layer.

For example, the first and second lower free layers 231 and 233 of the lower dual free layer 230 and the upper free layer 240 may each be formed of a ferromagnetic material such as a Full-Heusler semimetal alloy, an amorphous rare-earth element alloy, a multilayer thin film in which a ferromagnetic metal and a nonmagnetic metal are alternately laminated, or an alloy having an L10-type crystal structure.

In addition, the upper spacing layer 232 may be formed of a material having a bcc structure without magnetization. Accordingly, the first lower free layer 231 may be magnetized in the vertical direction, the upper spacing layer 232 may not be magnetized, and the second lower free layer 233 may be magnetized in the vertical or horizontal direction.

In this case, the first and second lower free layers 231 and 233 may each be formed of CoFeB and may be formed so that the thickness of the first lower free layer 231 is less than or equal to that of the second lower free layer 233. In addition, the upper spacing layer 232 may be formed to be thinner than the first and second lower free layers 231 and 233. For example, the first and second lower free layers 231 and 233 may each be formed using CoFeB to have a thickness of 0.5 nm to 1.5 nm, and the upper spacing layer 232 may be formed using a material having a bcc structure, e.g., W, to have a thickness of 0.2 nm to 0.5 nm.

In addition, the first lower free layer 231 may further include Fe to further increase a perpendicular magnetization. Accordingly, the first lower free layer 231 may be formed by laminating Fe and CoFeB. In this case, the thickness of Fe may be less than that of CoFeB, e.g., may be 0.3 nm to 0.5 nm.

In addition, the upper free layer 240 may be formed using CoFeB to have a thickness of 0.8 nm to 1.5 nm.

The capping layer 241 may be formed on an upper portion of the upper free layer 240. In addition, the capping layer 241 may be formed of a polycrystalline material, e.g., a conductive material having a bcc structure. For example, the capping layer 241 may be formed of tungsten (W) or tantalum (Ta). When the capping layer 241 is formed of a polycrystalline material, the crystallinity of a magnetic tunnel junction may be improved.

The capping layer 241 serves to prevent diffusion of the top electrode 242. For example, the capping layer 241 may be formed of tantalum (Ta) to have a thickness of 0.3 nm to 0.5 nm, or may be formed of tungsten (W) to have a thickness of 2 nm to 5 nm.

The top electrode 242 may be formed on an upper portion of the capping layer 241, and may be formed using a conductive material such as a metal, a metal oxide, or a metal nitride. For example, the top electrode 242 may be formed using a single metal selected from the group consisting of tantalum (Ta), ruthenium (Ru), titanium (Ti), palladium (Pd), platinum (Pt), magnesium (Mg), and aluminum (Al) or an alloy thereof.

According to an embodiment of the present disclosure, the lower synthetic antiferromagnetic layer 210 may be the first magnetic layer $M_1$ shown in FIG. 1, a structure 220 including the upper synthetic antiferromagnetic layer 221, the bridge layer 222, and the pinned layer 223 may be the second magnetic layer $M_2$ shown in FIG. 1, the lower dual free layer 230 may be the third magnetic layer $M_3$ shown in FIG. 1, and the upper free layer 240 may be the fourth magnetic layer $M_4$ shown in FIG. 1.

In addition, the multi-bit perpendicular magnetic tunnel junction may implement multi-bit operation by exhibiting any one resistance state of first to fourth resistance states depending on the magnetization directions of the lower dual free layer 230 and the upper free layer 240.

The multi-bit operation of the multi-bit perpendicular magnetic tunnel junction according to the first embodiment will be described in more detail with reference to FIGS. 3 to 4C.

Figure 3:
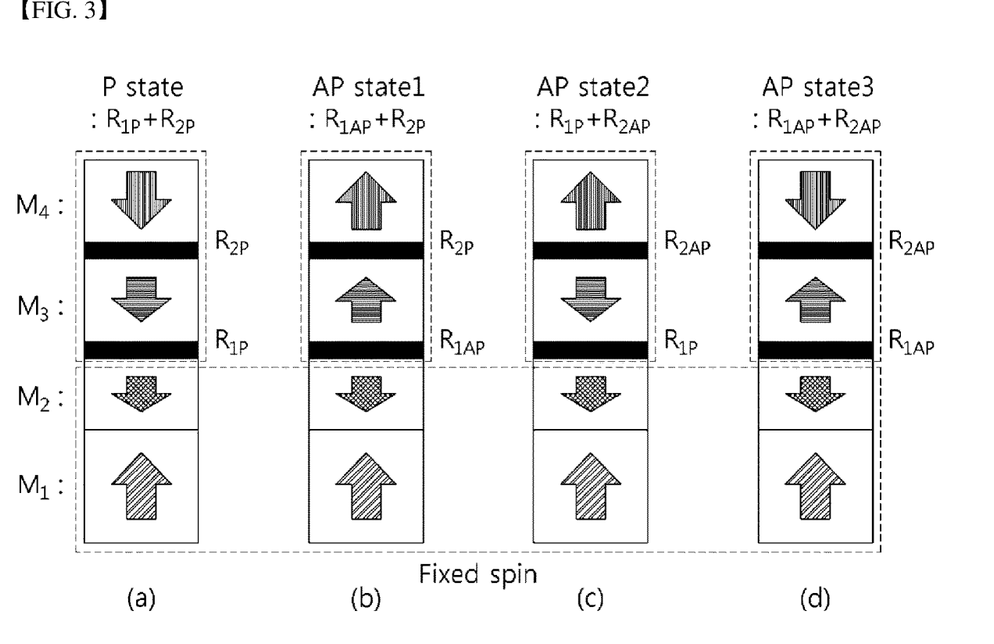
FIG. 3 shows an example of the resistance states of a multi-bit perpendicular magnetic tunnel junction according to a first embodiment of the present disclosure.

FIG. 3 shows an example of the resistance states of a multi-bit perpendicular magnetic tunnel junction according to a first embodiment of the present disclosure.

Referring to FIG. 3, (a) represents a parallel state (P state) of the multi-bit perpendicular magnetic tunnel junction according to the first embodiment, and (b) to (d) represent anti-parallel states (AP state 1, AP state 2, and AP state 3) of the multi-bit perpendicular magnetic tunnel junction according to the first embodiment, respectively.

According to (a) to (d) of FIG. 3, it can be seen that, in the multi-bit perpendicular magnetic tunnel junction according to the first embodiment, the magnetization directions of the first magnetic layer (lower synthetic antiferromagnetic layer, $M_1$) and the second magnetic layer (upper synthetic antiferromagnetic layer, bridge layer, and pinned layer, $M_2$) are fixed (Fixed spin), and 4 types of resistance states are exhibited depending on the magnetization directions of the third magnetic layer (lower dual free layer, $M_3$) and the fourth magnetic layer (upper free layer, $M_4$).

Specifically, in the multi-bit perpendicular magnetic tunnel junction according to the first embodiment, resistance difference may occur due to two free layers (lower dual free layer and upper free layer) and two tunnel barrier layers (lower tunnel barrier layer and upper tunnel barrier layer).

That is, in the multi-bit perpendicular magnetic tunnel junction according to the first embodiment, resistance difference may occur due to difference in the magnetization directions of the second magnetic layer $M_2$ and the third magnetic layer $M_3$, and resistance difference may occur due to difference in the magnetization directions of the third and fourth magnetic layers $M_3$ and $M_4$.

More specifically, the first resistance state (P state) may be a resistance state that appears when the magnetization direction of the second magnetic layer $M_2$ and the magnetization direction of the third magnetic layer $M_3$ are parallel ($R_{1P}$) and the magnetization directions of the third and fourth magnetic layers $M_3$ and $M_4$ are parallel ($R_{2P}$).

The second resistance state (AP state 1) may be a resistance state that appears when the magnetization direction of the second magnetic layer $M_2$ and the magnetization direction of the third magnetic layer $M_3$ are anti-parallel ($R_{1AP}$) and the magnetization directions of the third and fourth magnetic layers $M_3$ and $M_4$ are parallel ($R_{2P}$).

The third resistance state (AP state 2) may be a resistance state that appears when the magnetization direction of the second magnetic layer $M_2$ and the magnetization direction of the third magnetic layer $M_3$ are parallel ($R_{1P}$) and the magnetization directions of the third and fourth magnetic layers $M_3$ and $M_4$ are anti-parallel ($R_{2AP}$).

The fourth resistance state (AP state 3) may be a resistance state that appears when the magnetization direction of the second magnetic layer $M_2$ and the magnetization direction of the third magnetic layer $M_3$ are anti-parallel ($R_{1AP}$) and the magnetization directions of the third and fourth magnetic layers $M_3$ and $M_4$ are anti-parallel ($R_{2AP}$).

Figure 4A:
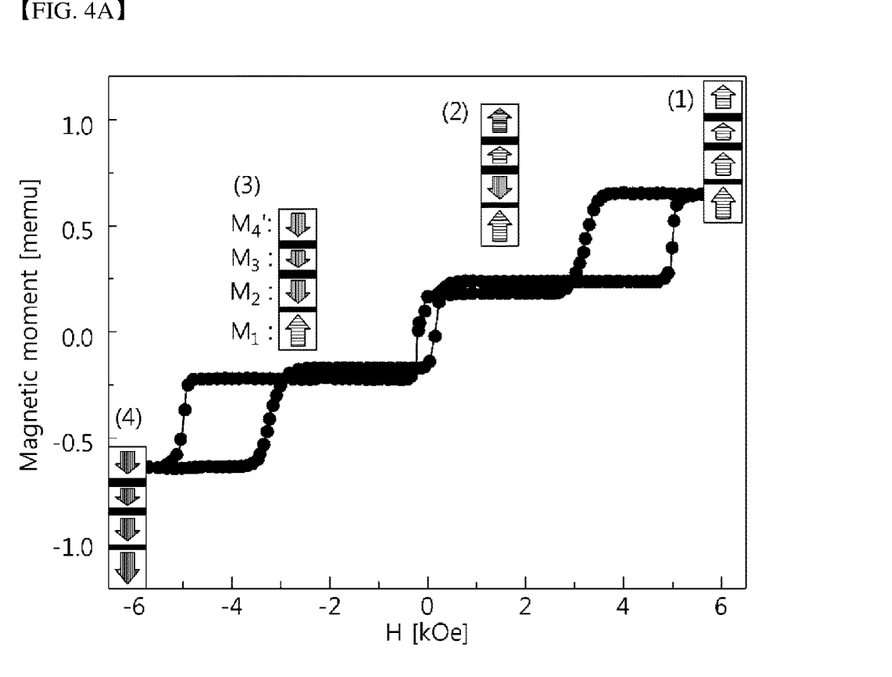
FIGS. 4A and 4B are graphs showing the magnetic properties of a multi-bit perpendicular magnetic tunnel junction according to a first embodiment of the present disclosure.
Figure 4B:
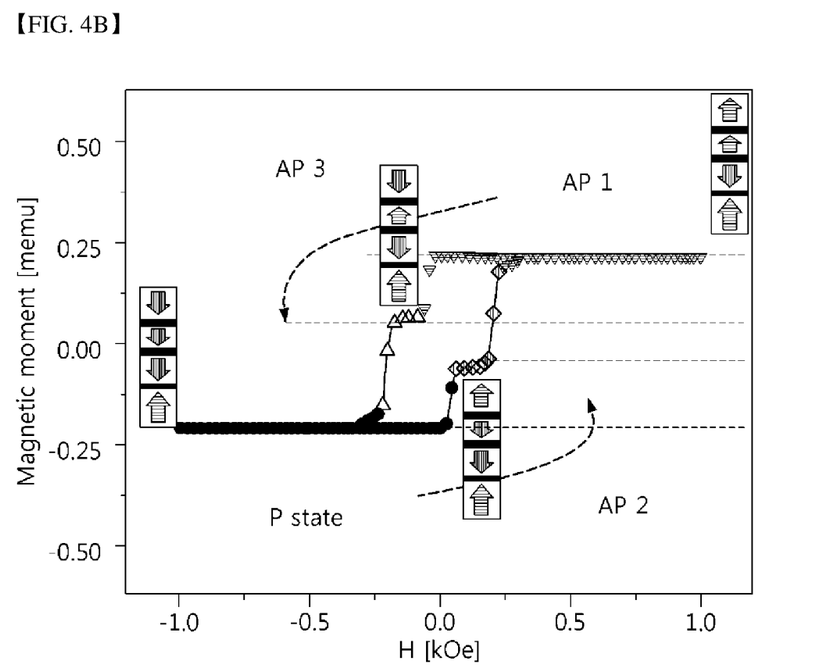
Figure 4C:
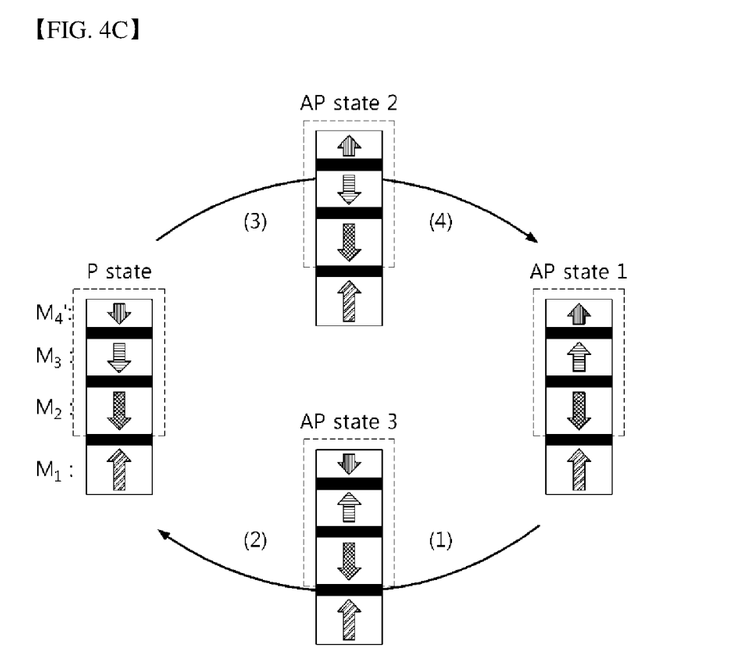
FIG. 4C shows an example of the switching properties of the resistance states of a multi-bit perpendicular magnetic tunnel junction according to a first embodiment of the present disclosure.

FIGS. 4A and 4B are graphs showing the magnetic properties of a multi-bit perpendicular magnetic tunnel junction according to a first embodiment of the present disclosure, and FIG. 4C shows an example of the switching properties of the resistance states of a multi-bit perpendicular magnetic tunnel junction according to a first embodiment of the present disclosure.

Referring to FIGS. 4A to 4C, FIG. 4A shows the magnetic moment characteristics of the multi-bit perpendicular magnetic tunnel junction according to the first embodiment depending on the magnitude (H) of an external magnetic field in a range of +4 kOe to −4 kOe, FIG. 4B shows the magnetic moment characteristics of the multi-bit perpendicular magnetic tunnel junction according to the first embodiment depending on the magnitude of an external magnetic field in a range of +1 kOe to −1 kOe, and FIG. 4C shows the switching properties of the resistance states of the multi-bit perpendicular magnetic tunnel junction according to the first embodiment in FIG. 4B.

According to FIG. 4A, it can be confirmed that, in regions where an external magnetic field is +4 kOe or more, the magnetization directions of the first to fourth magnetic layers ($M_1$ to $M_4$) of the multi-bit perpendicular magnetic tunnel junction according to the first embodiment are aligned in up-spin, and in regions where an external magnetic field is near 3 kOe, the magnetization direction of the second magnetic layer $M_2$ of the multi-bit perpendicular magnetic tunnel junction is switched to down-spin.

In addition, it can be confirmed that, in regions where an external magnetic field is near −2 KOe, the third and fourth magnetic layers $M_3$ and $M_4$ of the multi-bit perpendicular magnetic tunnel junction are switched to down-spin, and in regions where an external magnetic field is −4 kOe or less, the magnetization direction of the first magnetic layer $M_1$ of the multi-bit perpendicular magnetic tunnel junction is switched to down-spin.

According to FIGS. 4B and 4C, when the magnitude of an external magnetic field is swept in a range of a predetermined first threshold value to a predetermined second threshold value, the resistance state of the multi-bit perpendicular magnetic tunnel junction according to the first embodiment may be sequentially switched in an order of the second resistance state (AP 1), the fourth resistance state (AP 3), the first resistance state (P state), and the third resistance state (AP 2). For example, the first threshold value may be +1 kOe, and the second threshold value may be −1 kOe.

Specifically, when an external magnetic field is swept from +1 kOe to −1 kOe, the magnetization direction of the fourth magnetic layer may be switched to down-spin (AP 1→AP 3), and then the magnetization direction of the third magnetic layer may be switched to down-spin (AP 1→P state).

In addition, when an external magnetic field is swept from −1 kOe to +1 kOe, the magnetization direction of the fourth magnetic layer may be switched to up-spin (P state→AP 2), and then the magnetization direction of the third magnetic layer may be switched to up-spin (AP 2→AP 1).

Figure 5:
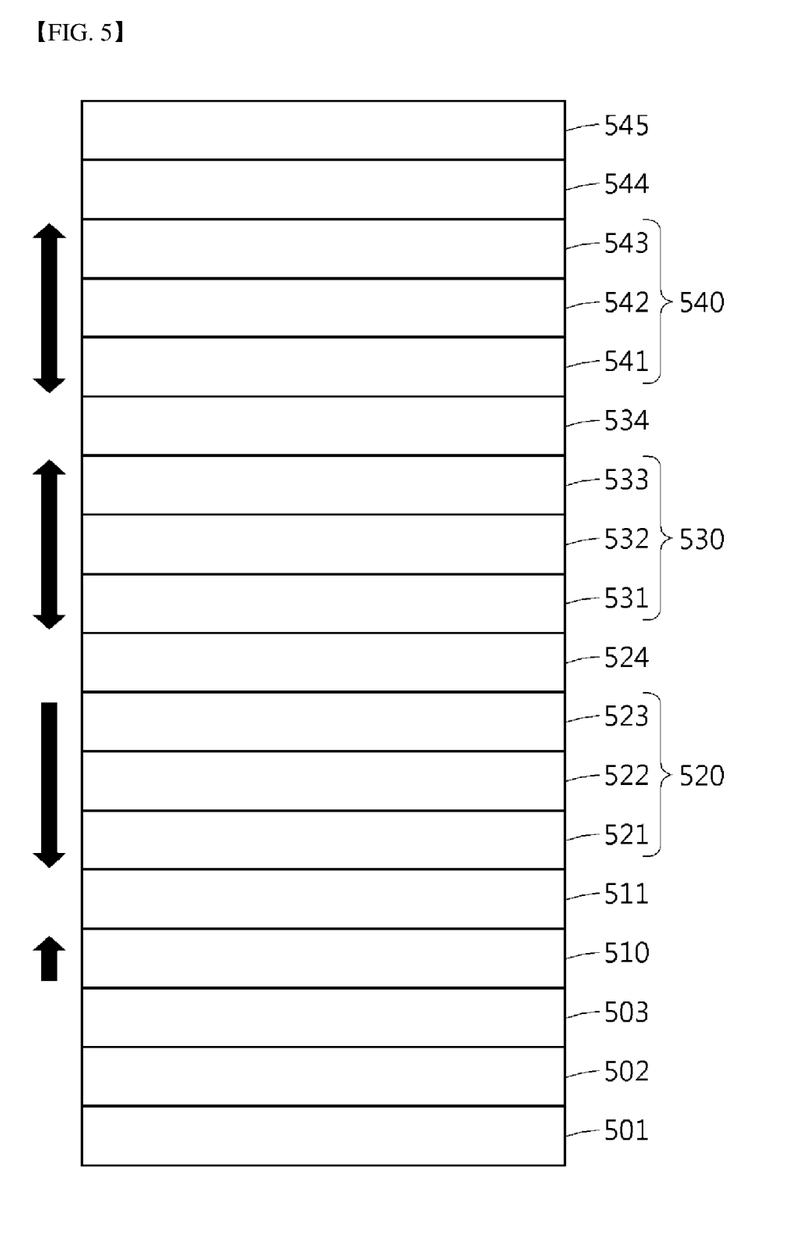
FIG. 5 is a cross-sectional view of a multi-bit perpendicular magnetic tunnel junction according to a second embodiment of the present disclosure.

FIG. 5 is a cross-sectional view of a multi-bit perpendicular magnetic tunnel junction according to a second embodiment of the present disclosure.

Referring to FIG. 5, the multi-bit perpendicular magnetic tunnel junction according to the second embodiment may include an upper synthetic antiferromagnetic layer 521, pinned layer 523, lower dual free layer 530, and upper multiple free layer 540 formed in a laminated manner between a top electrode 545 and a bottom electrode 502.

For example, the lower dual free layer 530 may include a first lower free layer 531, upper spacing layer 532, and second lower free layer 533 formed in a laminated manner.

According to an embodiment of the present disclosure, the multi-bit perpendicular magnetic tunnel junction according to the second embodiment may further include a lower synthetic antiferromagnetic layer 510 formed under the upper synthetic antiferromagnetic layer 521.

In addition, the multi-bit perpendicular magnetic tunnel junction according to the second embodiment may further include a lower spacing layer 511 formed between the lower and upper synthetic antiferromagnetic layers 510 and 521 and a lower bridge layer 522 provided between the upper synthetic antiferromagnetic layer 521 and the pinned layer 523.

In addition, the multi-bit perpendicular magnetic tunnel junction according to the second embodiment may further include a lower tunnel barrier layer 524 formed between the pinned layer 523 and the lower dual free layer 530 and an upper tunnel barrier layer 534 formed between the lower dual free layer 530 and the upper multiple free layer 540.

In addition, the multi-bit perpendicular magnetic tunnel junction according to the second embodiment may further include a capping layer 544 formed between the top electrode 545 and the upper multiple free layer 540, a seed layer 503 formed on an upper portion of the bottom electrode 502, and a substrate 501 formed on a lower portion of the bottom electrode 502.

The substrate 501, the bottom electrode 502, the seed layer 503, the lower synthetic antiferromagnetic layer 510, the lower spacing layer 511, the upper synthetic antiferromagnetic layer 521, the lower bridge layer 522, the pinned layer 523, the lower tunnel barrier layer 524, the lower dual free layer 530, the upper tunnel barrier layer 534, the capping layer 544, and the top electrode 545, which are included in the multi-bit perpendicular magnetic tunnel junction according to the second embodiment, may be respectively configured in the same manner as the substrate 201, the bottom electrode 202, the seed layer 203, the lower synthetic antiferromagnetic layer 210, the lower spacing layer 211, the upper synthetic antiferromagnetic layer 221, the bridge layer 222, the pinned layer 223, the lower tunnel barrier layer 224, the lower dual free layer 230, the upper tunnel barrier layer 234, the capping layer 241, and the top electrode 242, which are included in the multi-bit perpendicular magnetic tunnel junction according to the first embodiment described with reference to FIG. 2.

Therefore, when the multi-bit perpendicular magnetic tunnel junction is described with reference to FIG. 5, description overlapping with that in FIG. 2 will be omitted.

According to an embodiment of the present disclosure, the upper multiple free layer 540 may be formed on an upper portion of the upper tunnel barrier layer 534, and may include a first upper free layer 541, upper bridge layer 542, and second upper free layer 543 formed in a laminated manner.

Specifically, the first and second upper free layers 541 and 543 may each formed of a ferromagnetic material such as a Full-Heusler semimetal alloy, an amorphous rare-earth element alloy, a multilayer thin film in which a ferromagnetic metal and a nonmagnetic metal are alternately laminated, or an alloy having an L10-type crystal structure.

Preferably, the first upper free layer 541 may be formed in CoFeB, and the second upper free layer 543 may be formed in a multilayer structure based on $[Co/Pt]_b$.

As a more specific example, the second upper free layer 543 may be formed of $[Co/Pt]_6$, in which Co and Pt are repeatedly laminated six times. In this case, Co may be formed to have a thickness of, e.g., 0.3 nm to 0.5 nm, and Pt may be formed to have a thickness thinner than or equal to Co, e.g., a thickness of 0.2 nm to 0.4 nm.

The upper bridge layer 542 may be formed between the first and second upper free layers 541 and 543, and may be formed of a polycrystalline material, e.g., a conductive material having a bcc structure. Preferably, the upper bridge layer 542 is formed of tungsten (W). In addition, the bridge layer 222 may be formed to have a thickness of, e.g., 0.3 nm to 0.5 nm.

According to an embodiment of the present disclosure, the lower synthetic antiferromagnetic layer 510 may be the first magnetic layer $M_1$ shown in FIG. 1, a structure 520 including the upper synthetic antiferromagnetic layer 521, the lower bridge layer 522, and the pinned layer 523 may be the second magnetic layer $M_2$ shown in FIG. 1, the lower dual free layer 530 may be the third magnetic layer $M_3$ shown in FIG. 1, and the upper multiple free layer 540 may be the fourth magnetic layer $M_4$ shown in FIG. 1.

In addition, the multi-bit perpendicular magnetic tunnel junction may implement multi-bit operation by exhibiting any one resistance state of first to fourth resistance states depending on the magnetization directions of the lower dual free layer 230 and the upper multiple free layer 540.

The multi-bit operation of the multi-bit perpendicular magnetic tunnel junction according to the second embodiment will be described in more detail with reference to FIGS. 6 to 7C.

Figure 6:
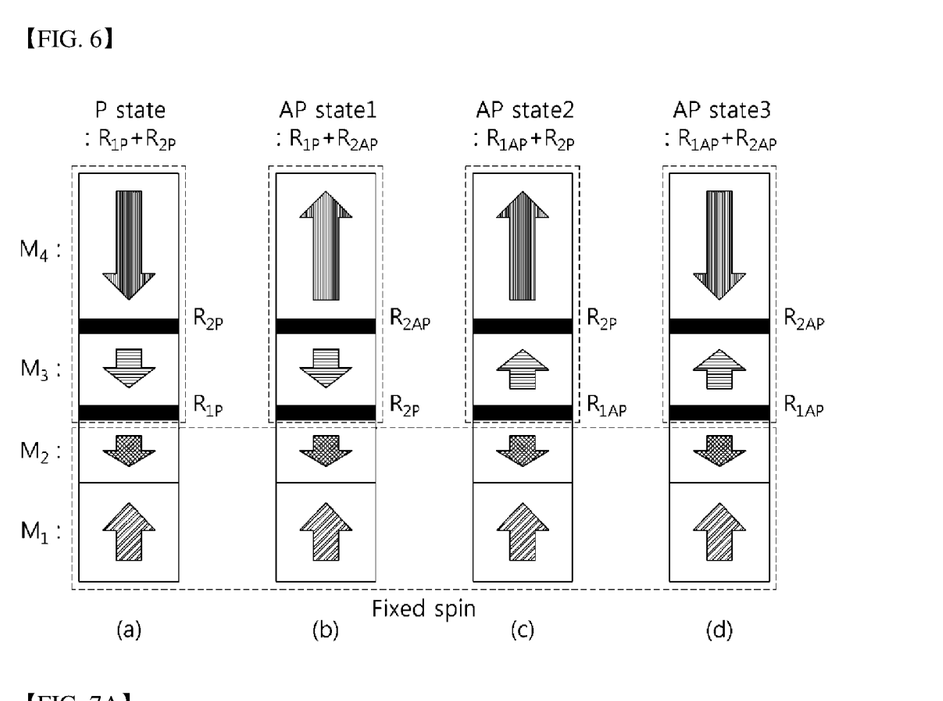
FIG. 6 shows an example of the resistance states of a multi-bit perpendicular magnetic tunnel junction according to a second embodiment of the present disclosure.

FIG. 6 shows an example of the resistance states of a multi-bit perpendicular magnetic tunnel junction according to a second embodiment of the present disclosure.

Referring to FIG. 6, (a) represents a parallel state (P state) of the multi-bit perpendicular magnetic tunnel junction according to the second embodiment, and (b) to (d) represent anti-parallel states (AP state 1, AP state 2, and AP state 3) of the multi-bit perpendicular magnetic tunnel junction according to the second embodiment, respectively.

According to (a) to (d) of FIG. 6, it can be seen that, in the multi-bit perpendicular magnetic tunnel junction according to the second embodiment, the magnetization directions of the first magnetic layer (lower synthetic antiferromagnetic layer, $M_1$) and the second magnetic layer (upper synthetic antiferromagnetic layer, bridge layer, and pinned layer, $M_2$) are fixed (Fixed spin), and 4 types of resistance states are exhibited depending on the magnetization directions of the third magnetic layer (lower dual free layer, $M_3$) and the fourth magnetic layer (upper multiple free layer, $M_4$).

Specifically, in the multi-bit perpendicular magnetic tunnel junction according to the second embodiment, resistance difference may occur due to two free layers (lower dual free layer and upper multiple free layer) and two tunnel barrier layers (lower tunnel barrier layer and upper tunnel barrier layer).

That is, in the multi-bit perpendicular magnetic tunnel junction according to the second embodiment, resistance difference may occur due to difference in the magnetization directions of the second magnetic layer $M_2$ and the third magnetic layer $M_3$, and resistance difference may occur due to difference in the magnetization directions of the third and fourth magnetic layers $M_3$ and $M_4$.

More specifically, the first resistance state (P state) may be a resistance state that appears when the magnetization direction of the second magnetic layer $M_2$ and the magnetization direction of the third magnetic layer $M_3$ are parallel ($R_{1P}$) and the magnetization directions of the third and fourth magnetic layers $M_3$ and $M_4$ are parallel ($R_{2P}$).

The second resistance state (AP state 1) may be a resistance state that appears when the magnetization direction of the second magnetic layer $M_2$ and the magnetization direction of the third magnetic layer $M_3$ are parallel ($R_{1P}$) and the magnetization directions of the third and fourth magnetic layers $M_3$ and $M_4$ are anti-parallel ($R_{2AP}$).

The third resistance state (AP state 2) may be a resistance state that appears when the magnetization direction of the second magnetic layer $M_2$ and the magnetization direction of the third magnetic layer $M_3$ are anti-parallel ($R_{1AP}$) and the magnetization directions of the third and fourth magnetic layers $M_3$ and $M_4$ are parallel ($R_{2P}$).

The fourth resistance state (AP state 3) may be a resistance state that appears when the magnetization direction of the second magnetic layer $M_2$ and the magnetization direction of the third magnetic layer $M_3$ are anti-parallel ($R_{1AP}$) and the magnetization directions of the third and fourth magnetic layers $M_3$ and $M_4$ are anti-parallel ($R_{2AP}$).

Figure 7A:
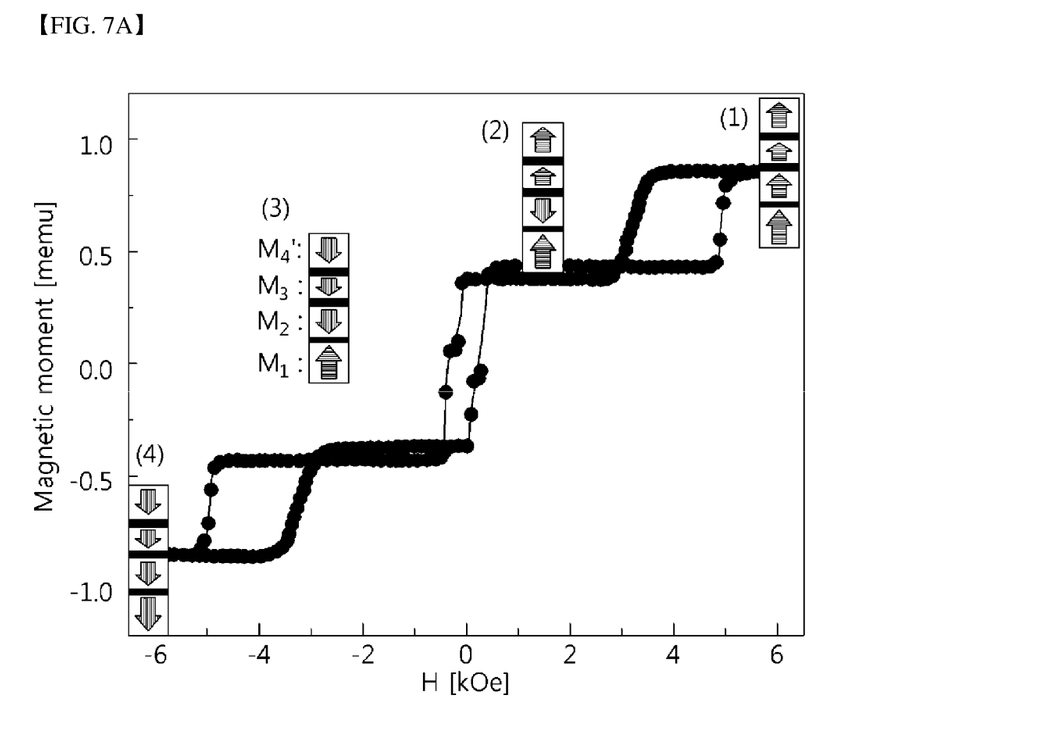
FIGS. 7A and 7B are graphs showing the magnetic properties of a multi-bit perpendicular magnetic tunnel junction according to a second embodiment of the present disclosure.
Figure 7B:
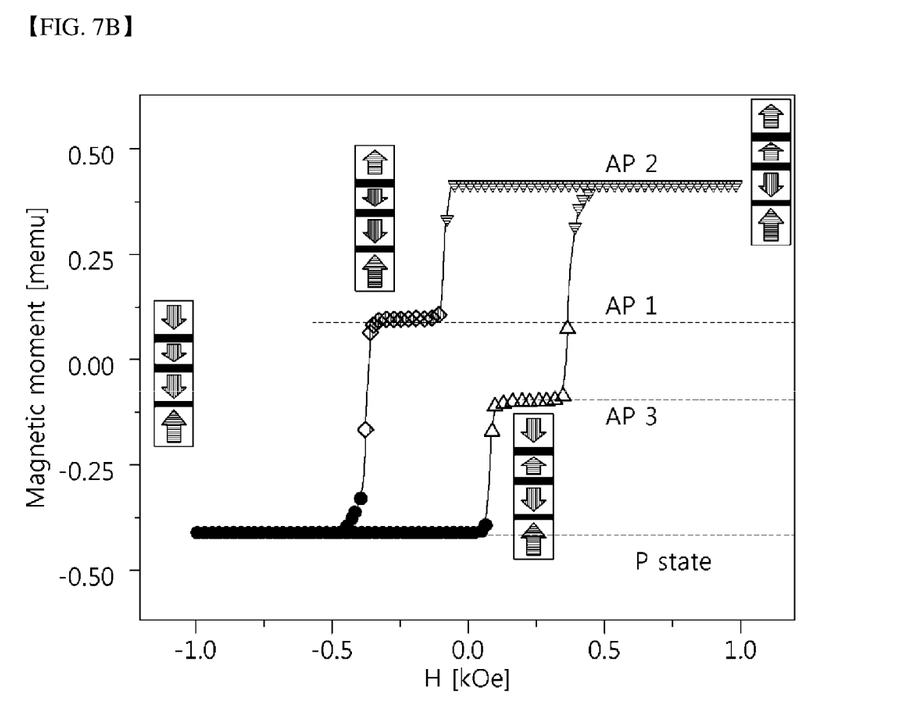
Figure 7C:
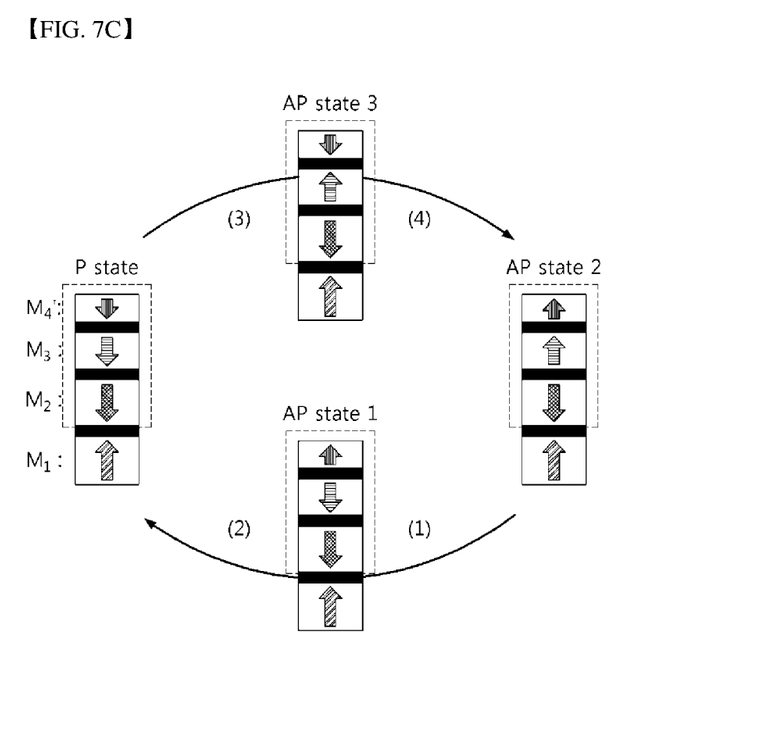
FIG. 7C shows an example of the switching properties of the resistance states of a multi-bit perpendicular magnetic tunnel junction according to a second embodiment of the present disclosure.

FIGS. 7A and 7B are graphs showing the magnetic properties of a multi-bit perpendicular magnetic tunnel junction according to a second embodiment of the present disclosure, and FIG. 7C shows an example of the switching properties of the resistance states of a multi-bit perpendicular magnetic tunnel junction according to a second embodiment of the present disclosure.

Referring to FIGS. 7A to 7C, FIG. 7A shows the magnetic moment characteristics of the multi-bit perpendicular magnetic tunnel junction according to the second embodiment depending on the magnitude (H) of an external magnetic field in a range of +4 kOe to −4 kOe, FIG. 7B shows the magnetic moment characteristics of the multi-bit perpendicular magnetic tunnel junction according to the second embodiment depending on the magnitude of an external magnetic field in a range of +1 kOe to −1 kOe, and FIG. 7C shows the switching properties of the resistance states of the multi-bit perpendicular magnetic tunnel junction according to the second embodiment in FIG. 7B.

According to FIG. 7A, it can be confirmed that, in regions where an external magnetic field is +4 kOe or more, the magnetization directions of the first to fourth magnetic layers ($M_1$ to $M_4$) of the multi-bit perpendicular magnetic tunnel junction according to the second embodiment are aligned in up-spin, and in regions where an external magnetic field is near 3 kOe, the magnetization direction of the second magnetic layer $M_2$ of the multi-bit perpendicular magnetic tunnel junction is switched to down-spin.

In addition, it can be confirmed that, in regions where an external magnetic field is near −2 KOe, the third and fourth magnetic layers $M_3$ and $M_4$ of the multi-bit perpendicular magnetic tunnel junction according to the second embodiment are switched to down-spin, and in regions where an external magnetic field is −4 kOe or less, the magnetization direction of the first magnetic layer $M_1$ of the multi-bit perpendicular magnetic tunnel junction is switched to down-spin.

According to FIGS. 7B and FIG. 7C, when the magnitude of an external magnetic field is swept in a range of a predetermined first threshold value to a predetermined second threshold value, the resistance state of the multi-bit perpendicular magnetic tunnel junction according to the second embodiment may be sequentially switched in an order of the third resistance state (AP 2), the second resistance state (AP 1), the first resistance state (P state), and the fourth resistance state (AP 3). For example, the first threshold value may be +1 kOe, and the second threshold value may be −1 kOe.

Specifically, unlike the multi-bit perpendicular magnetic tunnel junction according to the first embodiment, in the multi-bit perpendicular magnetic tunnel junction according to the second embodiment, due to the high coercivity of the upper multiple free layer (fourth magnetic layer, $M_4$), the lower dual free layer (third magnetic layer, $M_3$) may be switched first, and then the upper multiple free layer (fourth magnetic layer, $M_4$) may be switched.

That is, when an external magnetic field is swept from +1 kOe to −1 kOe, the magnetization direction of the third magnetic layer $M_3$ may be switched to down-spin (AP 2→AP 1), and then the magnetization direction of the fourth magnetic layer $M_4$ may be switched to down-spin (AP 1→P state).

In addition, when an external magnetic field is swept from −1 kOe to +1 kOe, the magnetization direction of the third magnetic layer $M_3$ may be switched to up-spin (P state→AP 3), and then the magnetization direction of the fourth magnetic layer $M_4$ may be switched to up-spin (AP 3→AP 1).

Figure 8A:
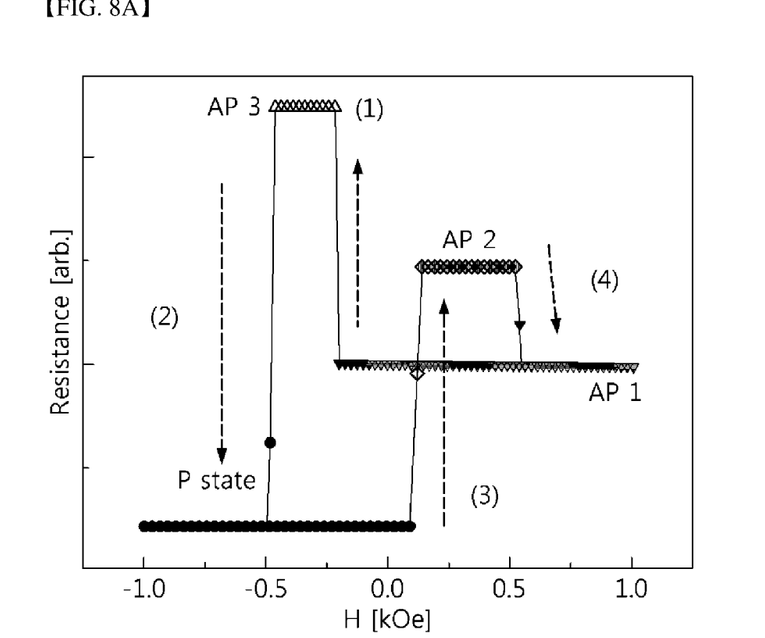
FIGS. 8A and 8B are graphs showing the resistance change properties of a multi-bit perpendicular magnetic tunnel junction according to a first embodiment of the present disclosure and a multi-bit perpendicular magnetic tunnel junction according to a second embodiment of the present disclosure.
Figure 8B:
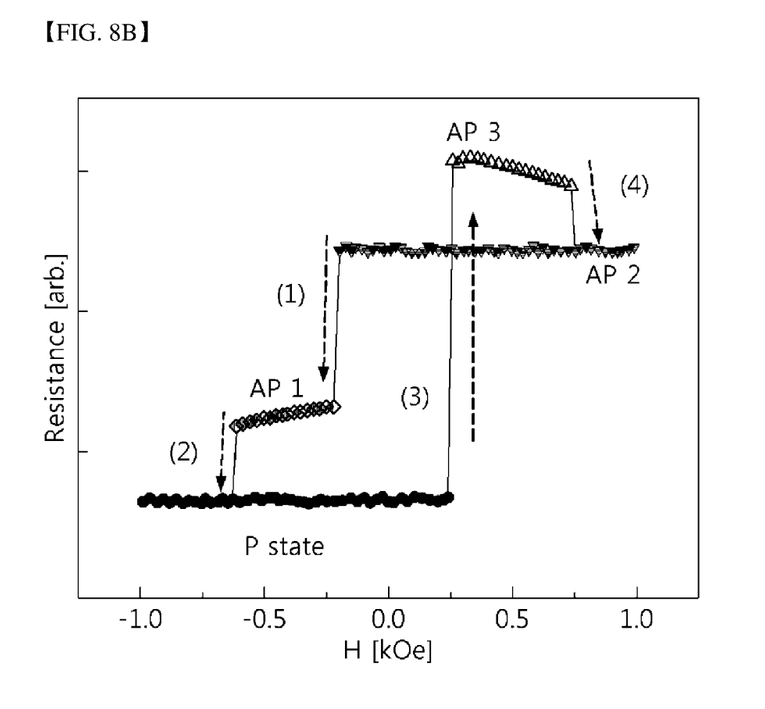

FIGS. 8A and 8B are graphs showing the resistance change properties of a multi-bit perpendicular magnetic tunnel junction according to a first embodiment of the present disclosure and a multi-bit perpendicular magnetic tunnel junction according to a second embodiment of the present disclosure.

Referring to FIGS. 8A and 8B, FIG. 8A shows change in the resistance of the multi-bit perpendicular magnetic tunnel junction according to the first embodiment depending on the magnitude (H) of an external magnetic field, and FIG. 8B shows change in the resistance of the multi-bit perpendicular magnetic tunnel junction according to the second embodiment depending on the magnitude of an external magnetic field.

According to FIGS. 8A and 8B, it can be confirmed that, when an external magnetic field is swept in a range of +1 kOe to −1 kOe, the resistance states of the multi-bit perpendicular magnetic tunnel junction according to the first embodiment are sequentially switched in an order of the second resistance state (AP 1), the fourth resistance state (AP 3), the first resistance state (P state), and the third resistance state (AP 2) and the resistance states of the multi-bit perpendicular magnetic tunnel junction according to the second embodiment are sequentially switched in an order of the third resistance state (AP 2), the second resistance state (AP 1), the first resistance state (P state), and the fourth resistance state (AP 3).

That is, the multi-bit perpendicular magnetic tunnel junction according to the first embodiment uses the upper free layer of a single-layer structure, and the multi-bit perpendicular magnetic tunnel junction according to the second embodiment uses the upper free layer of a multilayer structure. Accordingly, a range in which the magnetization directions of the lower dual free layer and the upper free layer are switched is changed, resulting in change in resistance state and difference in resistance-external magnetic field (R-H) characteristics.

According to an embodiment of the present disclosure, a multi-bit perpendicular magnetic tunnel junction capable of performing multi-bit operation by achieving four types of resistance states depending on the magnetization direction of a lower dual free layer and the magnetization direction of an upper free layer can be provided.

According to an embodiment of the present disclosure, a multi-bit perpendicular magnetic tunnel junction that can implement multi-bit operation through a simple structure using a lower dual free layer and an upper free layer and that allows high integration can be provided.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

DESCRIPTION OF SYMBOLS

110: BOTTOM ELECTRODE
120: TOP ELECTRODE
$M_1$: FIRST MAGNETIC LAYER
$M_2$: SECOND MAGNETIC LAYER
$M_3$: THIRD MAGNETIC LAYER
$M_4$: FOURTH MAGNETIC LAYER

What is claimed is:

1. A multi-bit perpendicular magnetic tunnel junction, comprising a first magnetic layer, a second magnetic layer, a third magnetic layer, and a fourth magnetic layer formed in a laminated manner between a top electrode and a bottom electrode,
   wherein the first magnetic layer includes a lower synthetic antiferromagnetic layer, the second magnetic layer includes an upper synthetic antiferromagnetic layer, a bridge layer, and a pinned layer, the third magnetic layer includes a lower dual free layer, and the fourth magnetic layer includes an upper free layer,
   wherein magnetization directions of the first magnetic layer and the second magnetic layer are fixed,
   wherein the multi-bit perpendicular magnetic tunnel junction exhibits one resistance state among first to fourth resistance states depending on magnetization directions of the third magnetic layer and the fourth magnetic layer.

2. The multi-bit perpendicular magnetic tunnel junction according to claim 1, wherein the first resistance state appears when magnetization directions of the upper synthetic antiferromagnetic layer and the pinned layer are parallel to a magnetization direction of the lower dual free layer, and the magnetization directions of the lower dual free layer and the upper free layer are parallel to each other.

3. The multi-bit perpendicular magnetic tunnel junction according to claim 1, wherein the second resistance state appears when magnetization directions of the upper synthetic antiferromagnetic layer and the pinned layer are anti-parallel to a magnetization direction of the lower dual free layer, and the magnetization directions of the lower dual free layer and the upper free layer are parallel to each other,
   the third resistance state appears when the magnetization directions of the upper synthetic antiferromagnetic layer and the pinned layer are parallel to the magnetization direction of the lower dual free layer, and the magnetization directions of the lower dual free layer and the upper free layer are anti-parallel to each other, and
   the fourth resistance state appears when the magnetization directions of the upper synthetic antiferromagnetic layer and the pinned layer are anti-parallel to the magnetization direction of the lower dual free layer, and the magnetization directions of the lower dual free layer and the upper free layer are anti-parallel to each other.

4. The multi-bit perpendicular magnetic tunnel junction according to claim 1, wherein, when a magnitude of a magnetic field applied from outside is swept in a range of a predetermined first threshold value to a predetermined second threshold value, the one resistance state is sequentially switched in an order of the second resistance state, the fourth resistance state, the first resistance state, and the third resistance state.

5. The multi-bit perpendicular magnetic tunnel junction according to claim 1, further comprising:
   a lower tunnel barrier layer formed between the pinned layer and the lower dual free layer; and
   an upper tunnel barrier layer formed between the lower dual free layer and the upper free layer.

6. The multi-bit perpendicular magnetic tunnel junction according to claim 1, wherein the lower dual free layer comprises a first lower free layer, an upper spacing layer, and a second lower free layer formed in the laminated manner.

7. The multi-bit perpendicular magnetic tunnel junction according to claim 1, further comprising:
   a lower spacing layer formed between the lower and upper synthetic antiferromagnetic layers.

8. A multi-bit perpendicular magnetic tunnel junction, comprising a first magnetic layer, a second magnetic layer, a third magnetic layer, and a fourth magnetic layer formed in a laminated manner between a top electrode and a bottom electrode,
   wherein the first magnetic layer includes a lower synthetic antiferromagnetic layer, the second magnetic layer includes an upper synthetic antiferromagnetic layer, a lower bridge layer, and a pinned layer, the third magnetic layer includes a lower dual free layer, and the fourth magnetic layer includes an upper multiple free layer,
   wherein magnetization directions of the first magnetic layer and the second magnetic layer are fixed,
   wherein the multi-bit perpendicular magnetic tunnel junction exhibits one resistance state among first to fourth resistance states depending on magnetization directions of the third magnetic layer and the fourth magnetic layer.

9. The multi-bit perpendicular magnetic tunnel junction according to claim 8, wherein the first resistance state appears when magnetization directions of the upper synthetic antiferromagnetic layer and the pinned layer are parallel to a magnetization direction of the lower dual free layer, and the magnetization directions of the lower dual free layer and the upper multiple free layer are parallel to each other.

10. The multi-bit perpendicular magnetic tunnel junction according to claim 8, wherein the second resistance state appears when magnetization directions of the upper synthetic antiferromagnetic layer and the pinned layer are parallel to a magnetization direction of the lower dual free layer, and the magnetization directions of the lower dual free layer and the upper multiple free layer are anti-parallel to each other,
   the third resistance state appears when the magnetization directions of the upper synthetic antiferromagnetic layer and the pinned layer are anti-parallel to the magnetization direction of the lower dual free layer, and the magnetization directions of the lower dual free layer and the upper multiple free layer are parallel to each other, and the fourth resistance state appears when the magnetization directions of the upper synthetic antiferromagnetic layer and the pinned layer are anti-parallel to the magnetization direction of the lower dual free layer, and the magnetization directions of the lower dual free layer and the upper multiple free layer are anti-parallel to each other.

11. The multi-bit perpendicular magnetic tunnel junction according to claim 8, wherein, when a magnitude of a magnetic field applied from outside is swept in a range of a predetermined first threshold value to a predetermined second threshold value, the one resistance state is sequentially switched in an order of the third resistance state, the second resistance state, the first resistance state, and the fourth resistance state.

12. The multi-bit perpendicular magnetic tunnel junction according to claim 8, further comprising:
   a lower tunnel barrier layer formed between the pinned layer and the lower dual free layer; and
   an upper tunnel barrier layer formed between the lower dual free layer and the upper multiple free layer.

13. The multi-bit perpendicular magnetic tunnel junction according to claim 8, wherein the upper multiple free layer comprises a first upper free layer, an upper bridge layer, and a second upper free layer formed in the laminated manner, and
   the second upper free layer is formed in a multilayer structure in which a cobalt (Co) layer and a platinum (Pt) layer are alternately stacked.

* * * * *